United States Patent [19]

Horii et al.

[11] Patent Number: 5,418,926
[45] Date of Patent: May 23, 1995

[54] SYSTEM AND METHOD FOR INDICATING WHETHER A BLOCK SIZE IN A DETACHABLE MEMORY DEVICE CORRESPONDS TO A PREDETERMINED BROADCASTING SYSTEM STANDARD

[75] Inventors: Hiroyuki Horii, Yokohama; Nobuaki Date, Kawasaki; Toshihiko Mimura; Akihiko Tojo, both of Yokohama; Hideaki Kawamura, Kawasaki; Yoshitaka Murata, Yokohama; Kan Takaiwa, Hachioji; Takashi Suzuki; Seiichi Ozaki, both of Yokohama; Junzo Taira, Tokyo; Kenichi Nagasawa, Kawasaki, all of Japan

[73] Assignee: Canon Kabushiki Kaisha, Tokyo, Japan

[21] Appl. No.: 987,240

[22] Filed: Dec. 7, 1992

Related U.S. Application Data

[63] Continuation of Ser. No. 446,442, Dec. 5, 1989, abandoned.

[30] Foreign Application Priority Data

Dec. 6, 1988 [JP] Japan ................ 63-308169
Dec. 9, 1988 [JP] Japan ................ 63-309933

[51] Int. Cl.⁶ ............ G06F 12/00; G06F 13/00; H04N 5/335; G11C 5/00
[52] U.S. Cl. ................ 395/425; 358/906; 358/909.1; 365/52; 365/230.03; 348/231
[58] Field of Search ........... 365/52, 230.03, 230.04, 365/230.06; 358/209, 213.11, 213.23, 906, 909; 395/425

[56] References Cited

U.S. PATENT DOCUMENTS

| | | | |
|---|---|---|---|
| 4,489,351 | 12/1984 | d'Alayer de Costemore d'Arc | 358/213.13 |
| 4,635,122 | 1/1987 | Kato et al. | 358/213 |
| 4,658,284 | 4/1987 | Kawamura et al. | 358/11 |
| 4,663,669 | 5/1987 | Kinoshita et al. | 358/213.19 |
| 4,667,228 | 5/1987 | Kawamura et al. | 358/80 |
| 4,774,585 | 9/1988 | Suga et al. | 358/213.19 |
| 4,779,137 | 10/1988 | Tojo et al. | 358/213.11 |
| 4,907,231 | 3/1990 | Watanabe et al. | 358/209 |
| 4,914,746 | 4/1990 | Nishi et al. | 358/909 |
| 4,982,378 | 1/1991 | Matsushita | 365/189.01 |
| 5,003,506 | 3/1991 | Itaya | 395/425 |
| 5,018,017 | 5/1991 | Sasaki et al. | 358/209 |
| 5,034,804 | 7/1991 | Sasaki et al. | 358/209 |
| 5,117,484 | 5/1992 | Nakagawa et al. | 395/100 |
| 5,153,729 | 10/1992 | Saito | 358/909 |

FOREIGN PATENT DOCUMENTS

| | | |
|---|---|---|
| 195608 | 9/1986 | European Pat. Off. . |
| 323194 | 7/1989 | European Pat. Off. . |
| 254095 | 2/1988 | German Dem. Rep. . |
| 60-81987 | 9/1985 | Japan . |
| 62-269581 | 11/1987 | Japan . |
| 63-224561 | 9/1988 | Japan . |
| 63-23289 | 1/1989 | Japan . |
| 1-044587 | 2/1989 | Japan . |

*Primary Examiner*—Glenn Gossage
*Attorney, Agent, or Firm*—Fitzpatrick, Cella, Harper & Scinto

[57] ABSTRACT

A method and system for providing a display on a device to which a detachable solid state memory devices, which includes a plurality of memory blocks, is attached. The method includes the steps of determining to which of a plurality of broadcasting system standards a detected size of each of the memory blocks in the solid state memory device corresponds, and providing a display on an apparatus to which the solid state memory device is attached, such as an electronic still camera, based on the detected size. In a preferred embodiment, the broadcasting standards are NTSC (National Television Systems Committee) and PAL (Phase Alternation Line). A user is warned when a detected size of each of the memory blocks is not a predetermined size, thus, not the correct broadcasting system standard for the apparatus. Each of the memory blocks stores data corresponding to one picture image.

10 Claims, 10 Drawing Sheets

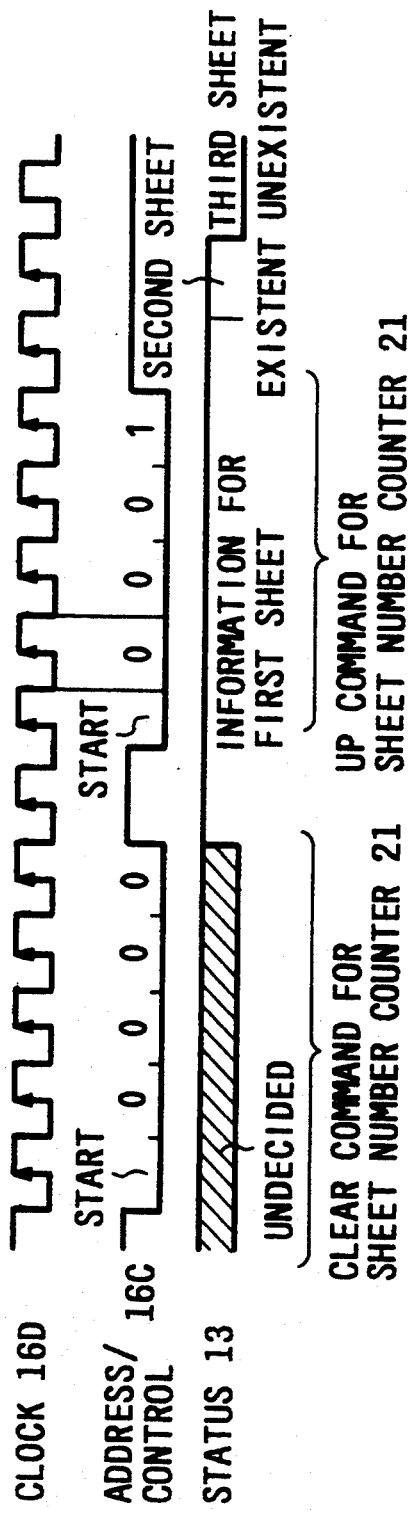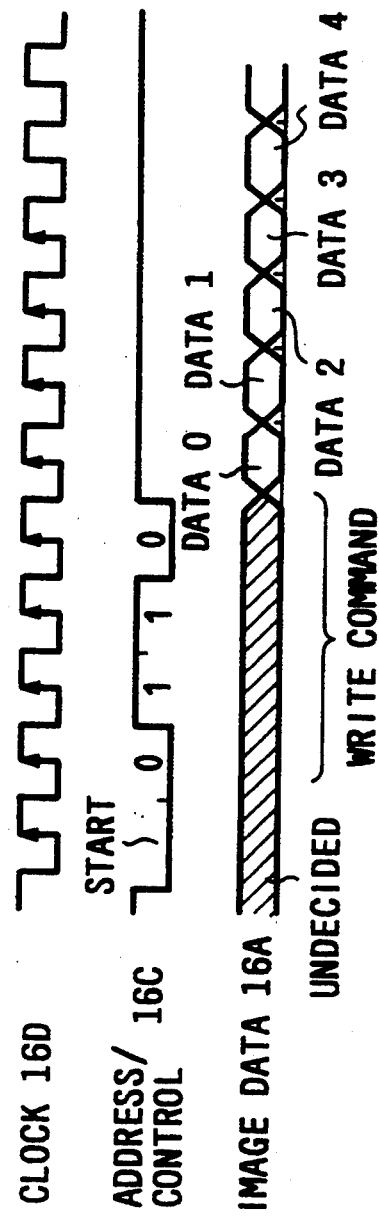

FIG. 16

| ADDRESS | CONTENT |
|---------|---------|
| 0 | 1 |
| 1 | 1 |
| 2 | 1 |
| 3 | 0 |
| ⋮ | ⋮ |
| 49 | 0 |
| 50 | 0 |

0: UNUSED AREA
1: USED AREA

SYSTEM AND METHOD FOR INDICATING WHETHER A BLOCK SIZE IN A DETACHABLE MEMORY DEVICE CORRESPONDS TO A PREDETERMINED BROADCASTING SYSTEM STANDARD

This application is a continuation of application Ser. No. 07/446,442 filed Dec. 5, 1989, now abandoned.

BACKGROUND OF THE INVENTION

1. Field of the Invention

The present invention relates to a memory device and an apparatus employing the memory device.

2. Related Background Art

Electronic still cameras employing magnetic floppy disks as the recording medium are already commercialized, but, due to the decreasing cost and increasing level of integration of semiconductor memories, recently there have been proposed electronic still camera systems employing solid-state memories such as semiconductor memories.

When use is made of a solid-state memory apparatus detachable from the camera body and composed of large-capacity integrated circuit (IC) memories as a recording medium, it is necessary to reduce the number of connecting lines which connect the solid-state memory with the camera body and yet still enable rapid access to the memory.

More specifically, the camera body and solid-state memory apparatus are connected by a serial data line and several control lines for the purpose of achieving simpler connection, higher reliability and lower cost, since the usual parallel structure of data lines and address lines, employed in the attached image memory, increases the number of connecting lines, thus deteriorating the reliability and increasing the cost.

A serial data line is ordinarily sufficient when the operating modes of the device do not require random access to the solid-state memory apparatus. However, high-speed random access capability in each image memory unit (block) is required, for example, in a high-speed continuous photographing operation or in random reproduction of the photographed images.

SUMMARY OF THE INVENTION

An object of the present invention is to provide an apparatus enabling Storage or readout of data to or from a memory apparatus by a simple operation or a simple structure.

Another object of the present invention is to provide an image processing system and an apparatus forming the system, capable of determining the size of an image stored in the memory.

Still another object of the present invention is to provide an image processing system and an apparatus therefor, capable of detecting the type of memory to thereby effect satisfactory control of the storage of image data into the memory according to the type of memory.

Still another object of the present invention is to provide an apparatus enabling storage or readout of data to or from a memory apparatus with a simple structure and a simple operation regardless of the image processing method used.

The foregoing objects can be attained, to a preferred embodiment of the present invention, by an apparatus provided with a memory capable of random data storage and readout, plural address generators for storing start addresses of each block in the memory, detecting means for detecting the type of image processing method used for storing data in or reading data out of the memory, and switch means for switching the start address of the block, whereby the address need not be calculated when accessing a designated memory block in the memory. Consequently the host apparatus need only send the information designating a memory block for which access is desired, to the solid-state memory apparatus, so that high-speed data transfer is made possible with a limited number of signal lines. Accordingly, a memory can be utilized commonly and effectively, even if different processing methods are involved.

The foregoing and still other objects of the present invention, and the advantages thereof, will become fully apparent from the following description of embodiments, which is to be taken in conjunction with the attached drawings.

BRIEF DESCRIPTION OF THE DRAWINGS

FIG. 9 is a timing chart for reading data from a storage state holding memory;

FIG. 10 is a timing chart for writing data into the memory;

FIG. 16 is a view showing an example of the contents of the storage state holding memory.

DESCRIPTION OF THE PREFERRED EMBODIMENTS

Now the present invention will be clarified by embodiments thereof shown in the attached drawings.

Figure 1:
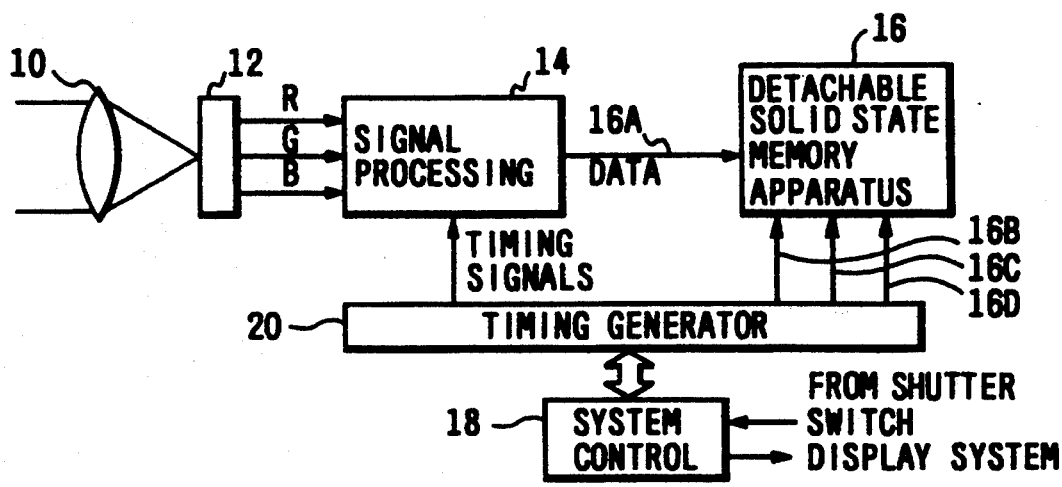
FIG. 1 is a block diagram of an embodiment of the present invention.

FIG. 1 is a block diagram of an embodiment of the present invention, applied to a solid-state electronic still camera employing an IC (Integrated Circuit) memory. Light penetrating a photographing lens 10 enters an image sensor 12 which thus generates RGB signals corresponding to the object. A signal processing circuit 14 converts the Red-Green-Blue (RGB) signals into image data, such as illuminance data and color difference data, or converted RGB data. The signal processing circuit 14 effects parallel-to-serial conversion of the image data, and serially sends the data to a solid-state memory apparatus 16 comprising an IC memory. A system control circuit 18 controls various circuit units, including a display device, in response to input signals, for example, from a shutter switch. A timing generator 20 sends a series of sequence timing signals to the signal processing circuit 14 and the solid-state memory apparatus 16, in response to the instructions from the system control circuit 18.

The lens 10, image Sensor 12, signal processing circuit 14, system control Circuit 18 and timing control circuit 20 are incorporated into the camera body, while the solid-state memory apparatus 16 is detachable therefrom. The solid-state memory apparatus 16 is connected to the camera body through a serial data line 16A, a clock line 16D, an address/control line 16C and a status line 16B. Naturally, there are additional lines such as power supply lines and various auxiliary signal lines, but they are omitted in the drawing since they are not directly related to the present invention.

Figure 2:
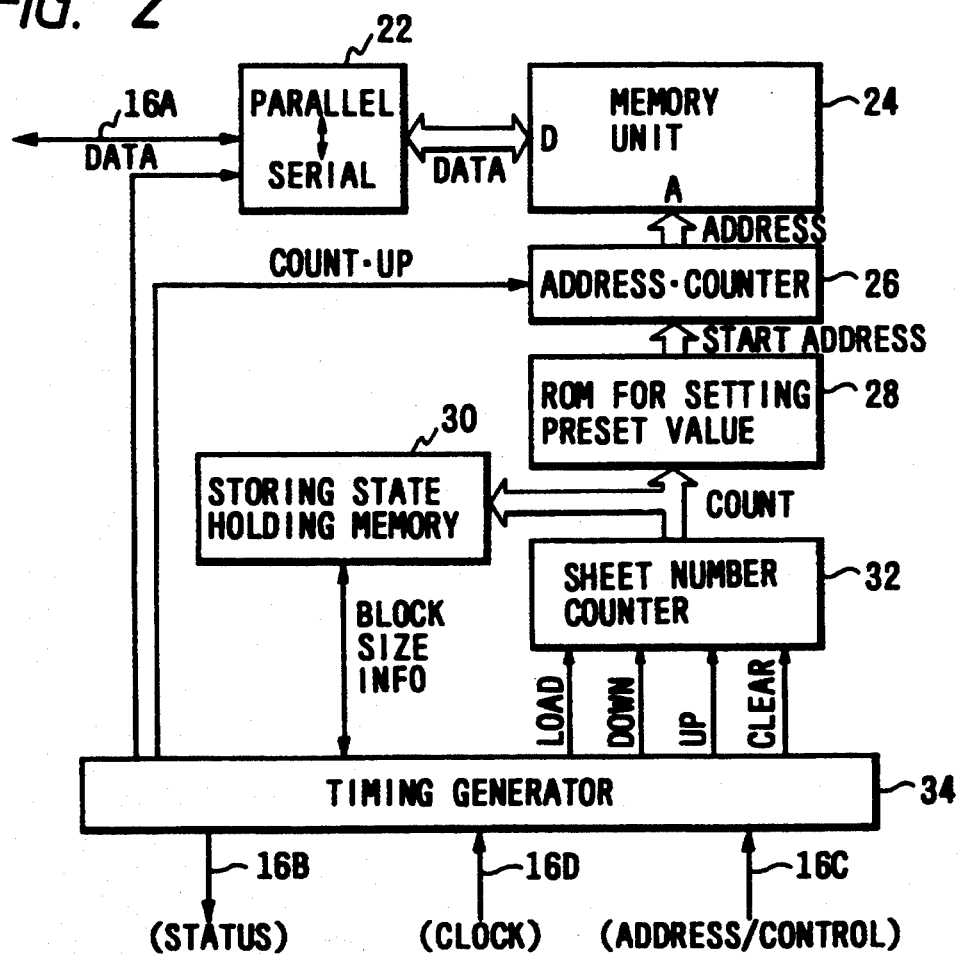
FIG. 2 is a block diagram of a solid-state memory apparatus 16 in FIG. 1.

FIG. 2 shows an example of the internal structure of the solid-state memory apparatus 16, wherein provided are a parallel-serial/serial-parallel converter 22; and memory unit 24 comprised of a semiconductor memory capable of random access; an address counter 26; a preset value setting ROM 28 for holding the preset value for the address counter 26; a storage state holding memory 30 for holding the storage state of the memory unit 24; a Sheet number counter 32; and a timing signal generator 34 for generating various timing signals according to the state of clocks line 16D, an address/control line 16C and a status line 16B. There are additionally provided power supply lines and various signals lines, but those not directly related to the present invention are omitted for the purpose of clarity.

Figure 3:
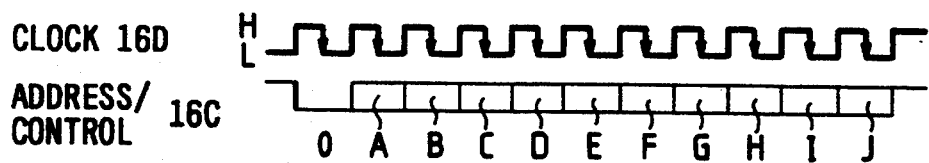
FIG. 3 is a timing chart of command signals for the solid-state memory apparatus 16.

FIG. 3 is a timing chart of mode settings for the solid-state memory apparatus 16. Correlation between the operating modes and the binary values of A, B, C and D in FIG. 3 is summarized in Table 1. The operating mode of the solid-state memory apparatus 16 can be set by sending a predetermined command through the address/control line 16C to the timing generator 34 of the solid-state memory apparatus 16. The sheet number counter 32 supplies the address for the preset value setting ROM 28, holding the start address of address counter 26 for each block. The output of the sheet number counter 32 is also used for addressing the storage state holding memory 30. In case the memory unit 24 has, for example, memory areas for 50 images, or 50 memory blocks, the storage state holding memory 30 stores 1-bit signals indicating the used/unused state of each block (for example "1" for used and "0" for unused). If the amount of information is 100 Kbytes per image, the memory capacity of the memory unit 24 is 5 Mbytes for 50 images. FIG. 16 shows an example of the contents of the storage state holding memory.

Since the image storage or readout of the memory unit 24 is conducted by storing or reading an image at a time, the addresses generated by the address counter 26 can be increased in steps. Thus, the addresses to the memory unit 24 are generated from the address counter 26, and the data storage or readout is conducted pixel by pixel in synchronization with the clock signal. Since each pixel of the image has a density range of 6 to 8 bits, the access to the memory unit 24 is simultaneously made for plural bits corresponding to the density range. When data is readout from the memory unit 24, the obtained parallel data is sent to the parallel-serial/serial-parallel converter 22 for conversion into serial data. The storage of data into the memory unit 24 is conducted in inverse manner. The status line 16B is used for releasing the contents of the storage state holding memory 24, but can also be utilized for transmitting timing signals to perform other functions.

Figure 4A:
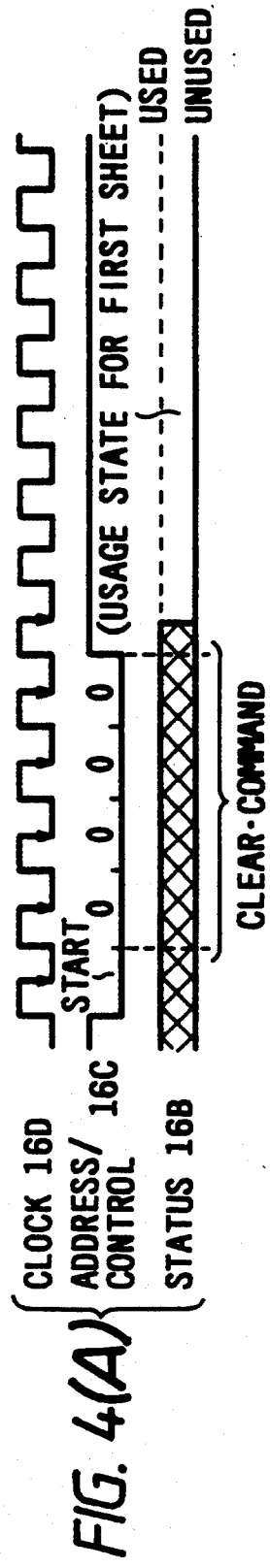
FIGS. 4A-4C are timing charts of a setting command signal for the sheet number counter 32 in FIG. 2.
Figure 4B:
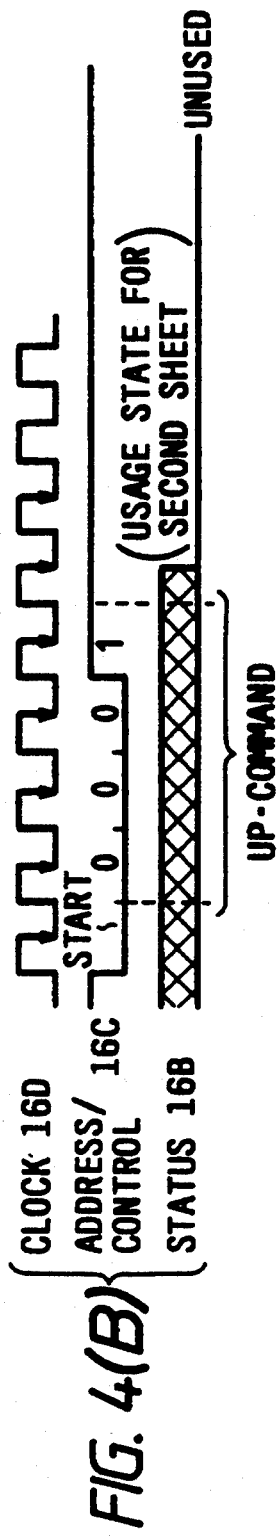
Figure 4C:
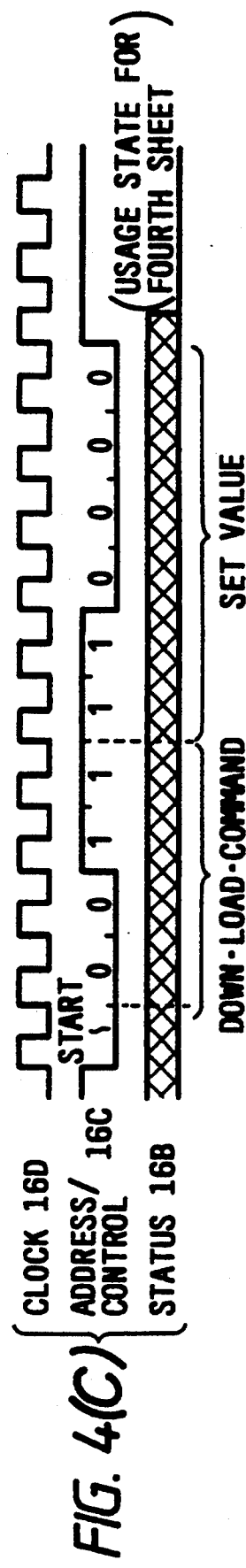

FIGS. 4A–4C are timing charts for a command signal for setting the sheet number counter 32. The signal on the address/control line 16C is sampled at the downshift edge of the clock signal on the clock line 16D. The signal on the line 16C is normally in the H-level, but a 4-bit command signal (cf. Tab 1) following a start bit determines the operating mode. Thereafter, the address-/control line 16C returns to the H-level state. For checking the empty areas of the solid-state memory apparatus 16, a clear command signal is sent from the camera body (FIG. 4(A)), and, in response, the counter 32 is cleared. Thus, the used/unused data of the 1st block of the memory unit 24 is read from the storage state holding memory 30 and is sent to the camera body through the status line 16B.

Then, as shown in FIG. 4(B), a count-up command signal is sent from the camera body to the solid-state memory apparatus 16, thereby increasing the count of the counter 32 by one. Thus, the used/unused data of the 2nd block is read from the holding memory 30 and sent to the camera body through the status line 16B. The number of empty areas of the memory unit 24 can be confirmed by repeating the above-explained steps.

It is assumed that the first three blocks are already used. In case of image storage, a counter down-load command signal is sent from the camera body to the solid-state memory apparatus 16 with the timing shown in FIG. 4(C), followed by a set-value "3", thereby designating the 4th block. In the example shown in FIGS. 4(A)–4(C), 6 bits are sent in succession starting from the least significant bit. Thus, the preset value setting ROM 28 releases the start address of the 4th block.

Figure 5:
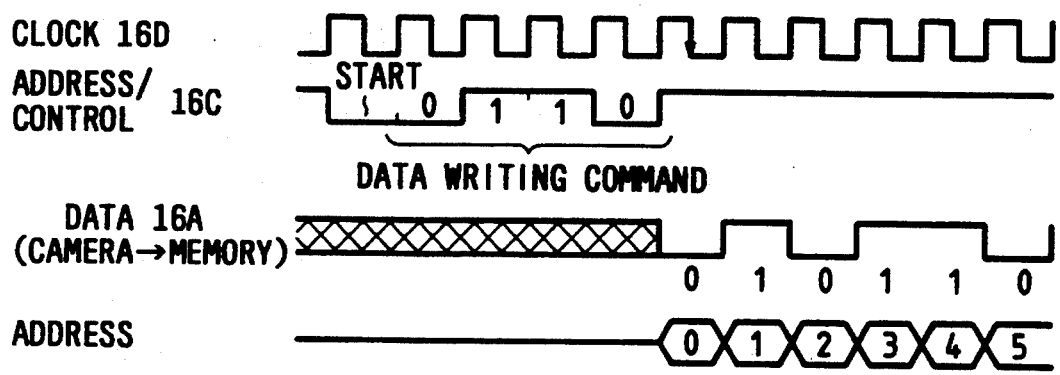
FIG. 5 is a timing chart of a .write command signal for the memory unit 24 in FIG. 2.

FIG. 5 is a timing chart of data storage into memory unit 24. At first, a data storage command signal is sent to the solid-state memory apparatus 16 through the address/control line 16C, and the data to be stored is sent through the data line 16A in synchronization with the clock signal on the clock line 16D. The address counter 26 is stepped up at the upshift of the clock signal, and the memory unit 24 fetches the data at the downshift of the clock signal. After the image data of an image is stored, the solid-state memory apparatus enters a stand-by state to wait for a next command.

Figure 6:
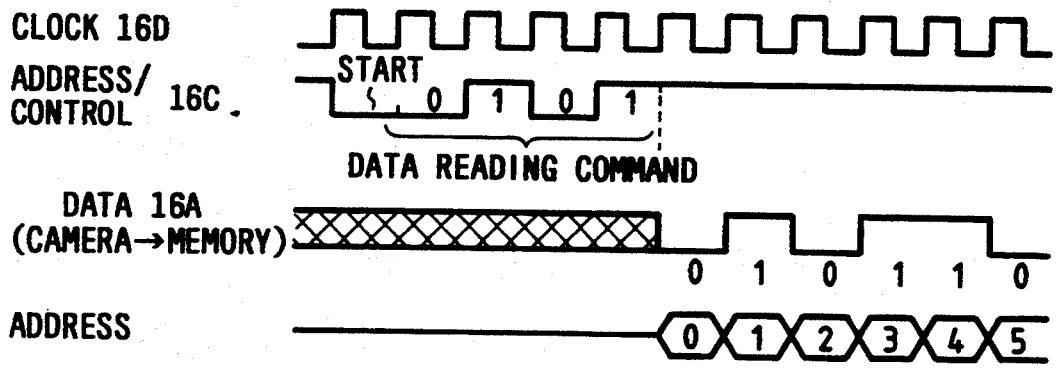
FIG. 6 is a timing chart of a read command signal for the memory unit 24.

FIG. 6 is a timing chart for data readout from the memory unit 24. In response to a memory readout command signal, as in the data storage procedure, the address counter 26 is stepped up at the upshift of the clock signal, and the stored data is read from the memory unit 24 at the downshift of the clock signal. The data read from the memory unit 24 is converted into serial signals by the parallel-serial/serial-parallel converter 22.

In the foregoing embodiment, the camera body and the solid-state memory apparatus 16 are connected by four signal lines, but it is also possible to use the clock line 16D and the data line 16A, or to expand functions by adding another control line (for example storage disable line). The status line 16B is usually used for confirming the contents of the storage state holding member 30, but it may naturally be used for other purposes. The storage of image data in the memory unit 24 may be made in various modes, such as by NTSC (National Television System Committee Standard Code) or PAL (Phase Alternation Line) signals, by luminance and color difference signals, by RGB signals, or by compressed signals.

TABLE 1

| ABCD | OPERATING MODE |
| --- | --- |
| 0000 | clear counter 32 |
| 0001 | count up counter 32 |
| 0010 | count down counter 32 |
| 0011 | down load counter 32 (followed by E-J) |
| 0100 | clear memory |
| 0101 | read from memory |
| 0110 | write into memory |
| 0111 | reserve system |
| 1XXX | reserve system |

As will be easily understood from the foregoing, the present embodiment enables high-speed access to an arbitrary data block with a limited number of signal lines. Also, the host apparatus is relieved from the burden of memory administration and address calculation.

In the foregoing embodiment, the serial data line is sufficient for access because normal operating modes do not involve random access to the solid-state memory apparatus, but a high-speed random access capability is required for each image memory block, for example, during a high-speed continuous photographing operation or a random reproduction of photographed images.

In the following there will be explained another embodiment of the solid-state memory apparatus requiring only a limited number of connecting lines, yet still having random access capability and enabling the use of a common memory regardless of the image processing methods used.

Since the structure shown in FIG. 1 employs a fixed ROM 28 in the address generator, the memory apparatus can no longer be used if the image processing method of the camera (for example NTSC, PAL HD (High Density), SECAM (Sequence Electronique Couleur avec Memoire), Hi-band etc.) is changed, thus varying the data length.

On the other hand, the following embodiment allows common use of a memory even if the image processing method of the camera is changed.

For this purpose the memory is equipped with means for identifying the image processing method employed in the camera, and with plural address generators.

Figure 7:
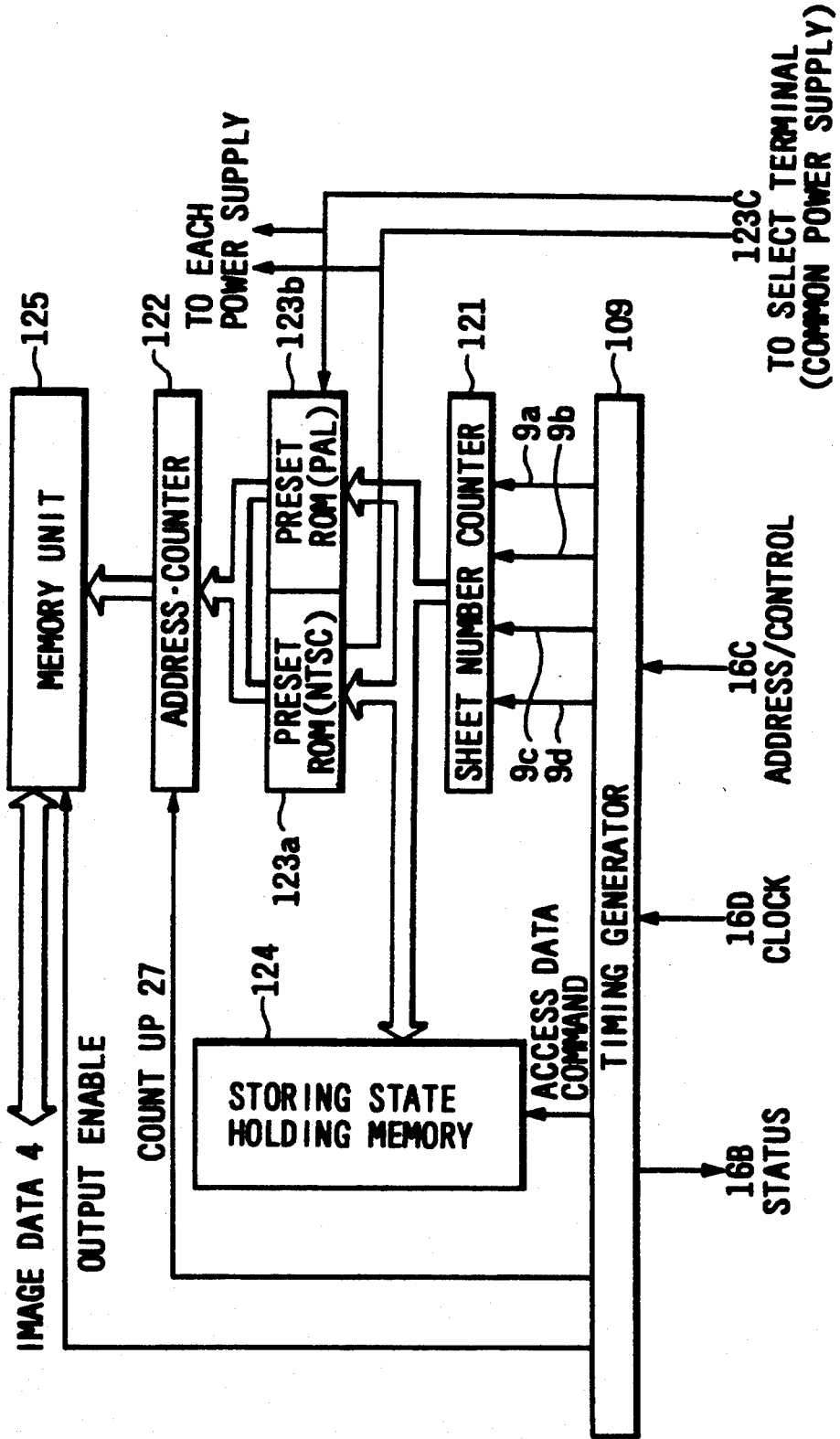
FIG. 7 is a block diagram of an IC memory apparatus in a second embodiment of the present invention.
Figure 8:
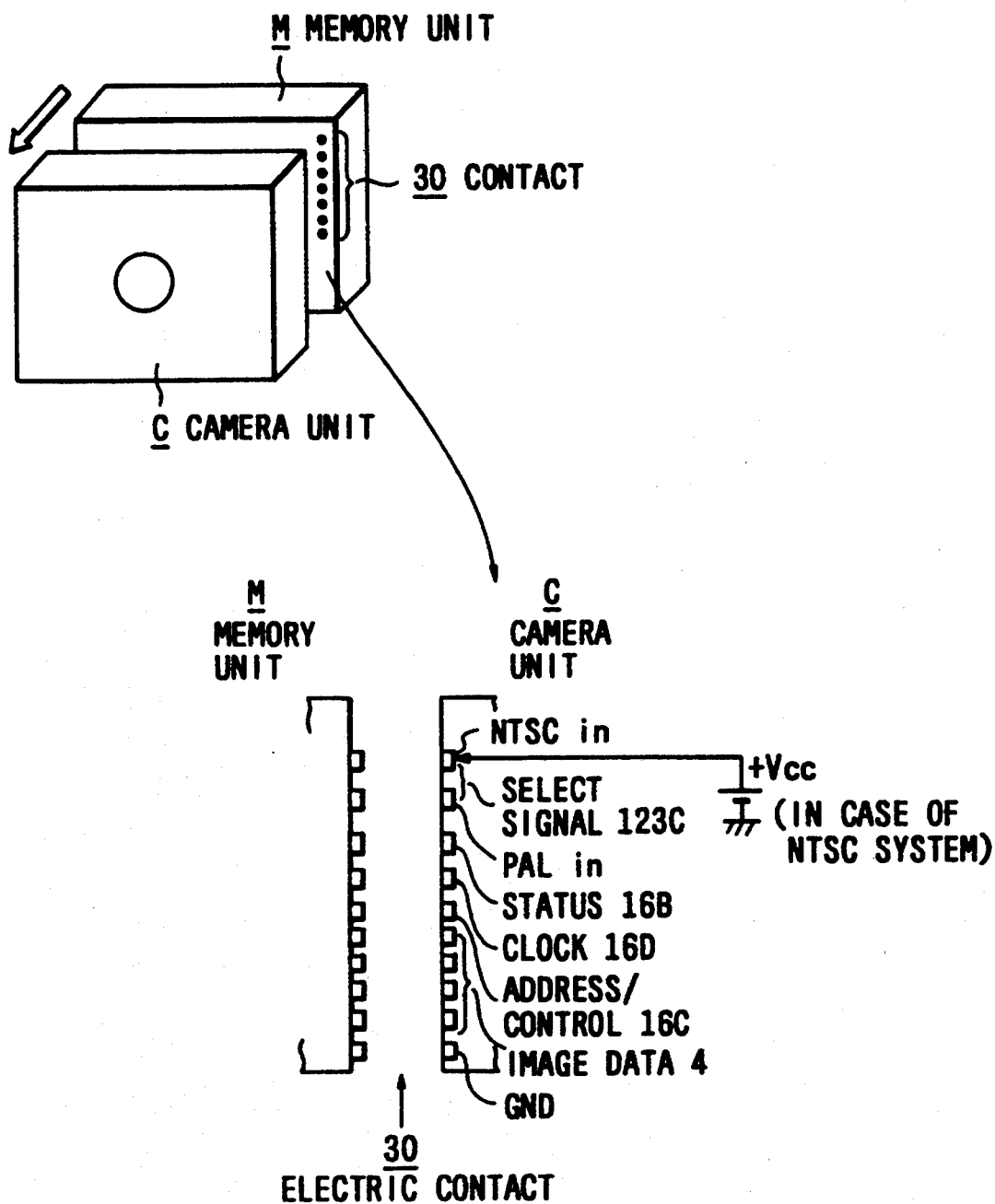
FIG. 8 is a view showing an example of the interconnection between the IC memory shown in FIG. 7 and a camera.

FIG. 7 is a block diagram of an embodiment of the IC memory apparatus of the present invention, and FIG. 8 shows an example of an interconnection between the memory and the camera.

(Structure)

The present embodiment provides a solid-state memory apparatus (pack) for NTSC and PAL systems, wherein two preset ROM's 123a, 123b are provided for setting the address counter 22. A select signal 123c for the ROM's 123a and 123b is provided by a contact provided on the electronic camera C. The camera C is equipped with a contact indicating the image processing system therein, so that the memory M can automatically identify an NTSC or PAL system.

In the structure shown in FIG. 7, there are provided an IC (main) memory 125 capable of random access; an address counter 122; a preset ROM 123a for NTSC system; a preset ROM 123b for PAL system; a storing state holding memory 124; a sheet number counter 121; and a timing signal generator 109. Lines 9a–9d supply Load, Clear, Up and Down signals between timing generator 109 and sheet number counter 121.

(Operation)

The function of the above-explained embodiment will now be explained.

At first, the selection of the preset ROM 123a or 123b is automatically made by mounting the memory apparatus M on the camera C, as shown in FIG. 8. As will be apparent from FIG. 8, which is a magnified view of the connectors provided on the memory M and camera C, the ROM 123a or 123b is automatically selected according to whether a terminal NTSC IN or PAL IN on the camera is powered. The camera C sends an access command signal to the storage state holding memory 124 from an address/control terminal 16C, for confirming the presence of an empty space in the memory 124. After a subsequent photographing operation, the camera C sends a write command signal from the address/control terminal 16C, and sounds out image and audio data 4 in synchronization with the clock signal 16D for successive storage in the memory.

FIG. 9 is a timing chart showing a representative example of readout of an empty area of thee storage state holding memory 124, and FIG. 10 is a timing chart showing a representative example of data storage.

(Another Embodiment)

Figure 11:
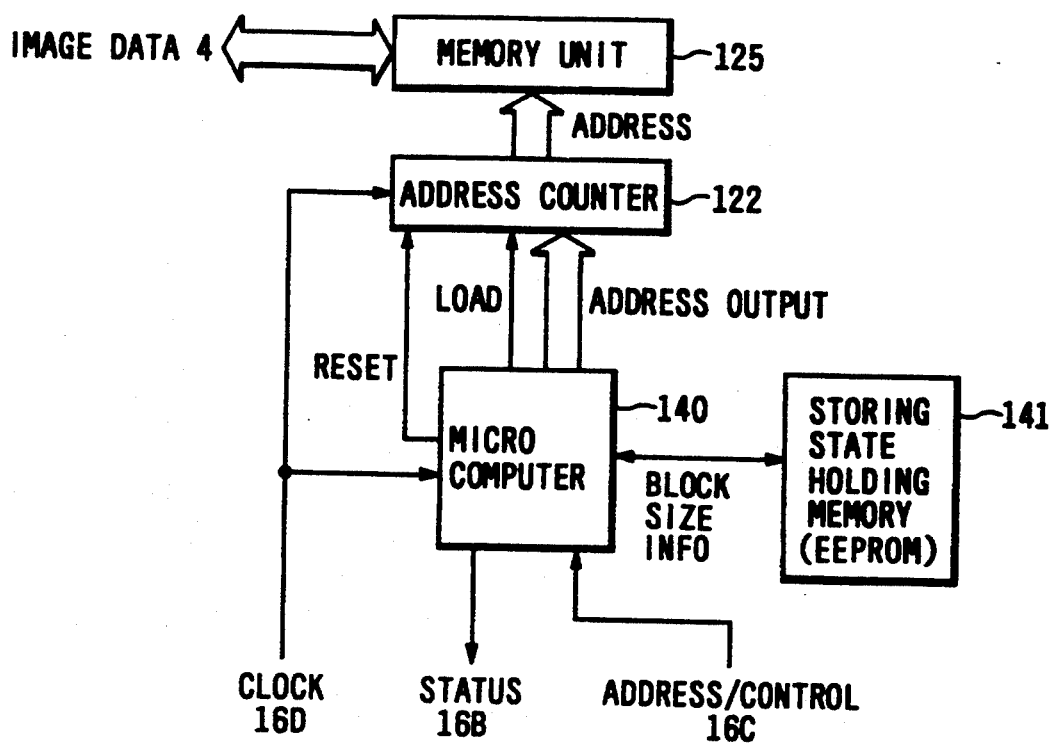
FIG. 11 is a block diagram of a third embodiment of the present invention.
Figure 12:
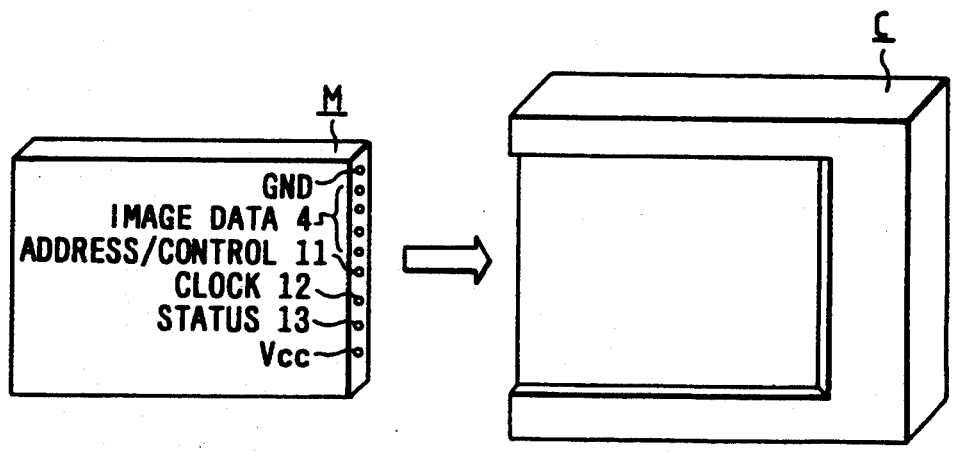
FIG. 12 is a view showing an example of the interconnection between the memory unit in FIG. 11 and a camera.

FIG. 11 is a block diagram of an IC memory apparatus constituting a third embodiment of the present invention, and FIG. 12 is an example of the interconnection between the memory and the camera.

In these drawings, the same or equivalent components as described in the first embodiment shown in FIGS. 7 and 8 are represented by the same numbers.

There is shown a main memory 125 capable of random access, an address counter 122, a microcomputer 140, and an EEPROM (electrically erasable programmable ROM) 141 serving as the storage state holding memory or an auxiliary memory for the microcomputer 140.

The above-explained memory apparatus is used in the following manner. The communication to the microcomputer 140 is conducted through the status line 16B and the address/control line 16C, in synchronization with the clock signal 16D from the camera. The storage state holding memory 141 comprised of the EEPROM stores information indicating the presence or absence of data in each block of the memory unit 125, the number and sizes of memory blocks, the total capacity of the main memory, etc. At the shipment of the memory from the factory, only the total capacity of memory is stored, and the number and sizes of the memory blocks is stored as zero.

Figure 13:
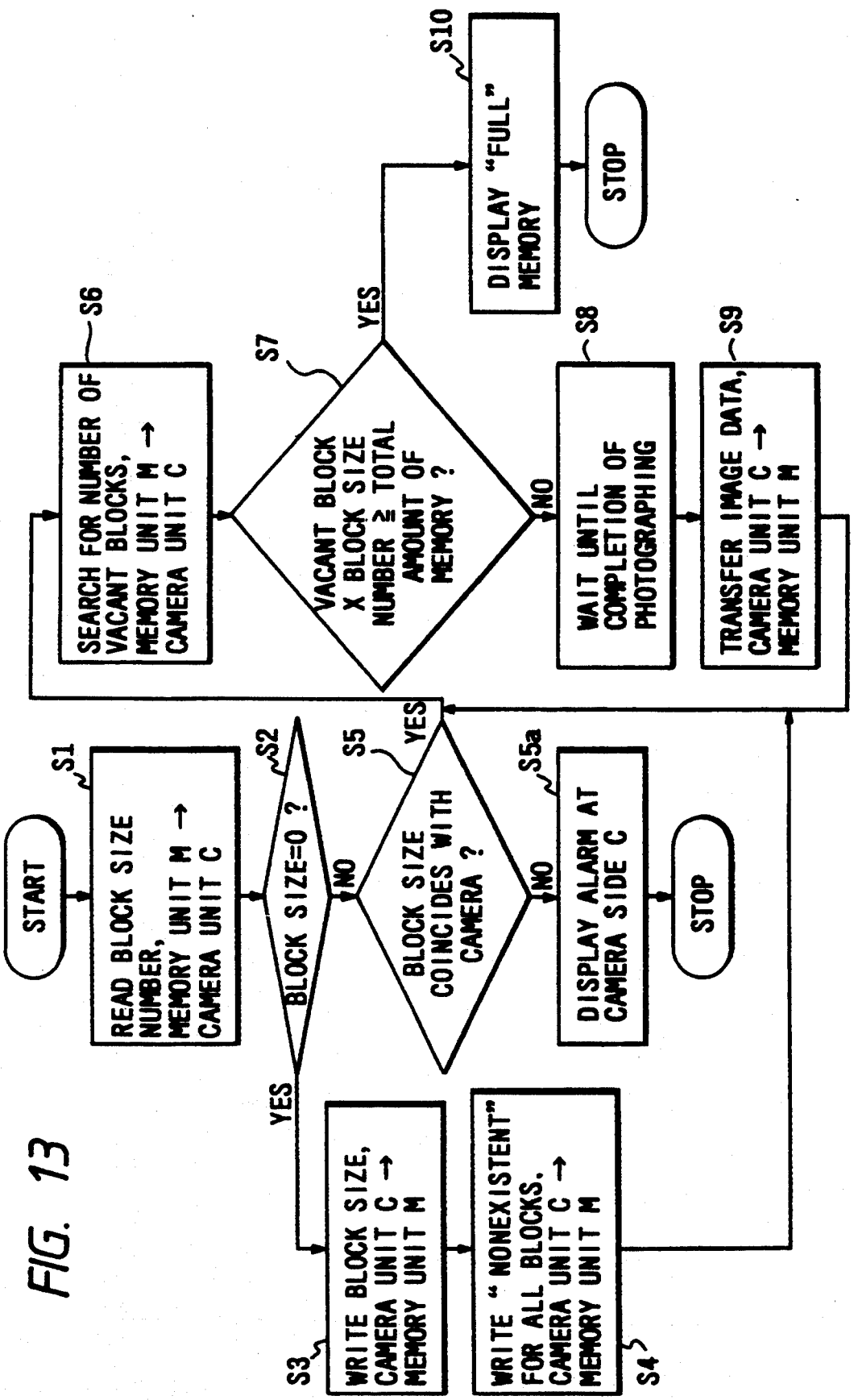
FIG. 13 is a flow chart showing the control sequence of the third embodiment.

FIG. 13 is a flow chart of the control sequence of the microcomputer 140 in the present embodiment. When the memory M is connected to the camera C, a step S1 reads the size of blocks in the memory through the status line 16B. If a step S2 identifies that the size is zero, a step S3 identifies that the memory apparatus M is unused, and writes a block size suitable for the camera C into the EEPROM 41 through the microcomputer 140. Then, a step S4 writes information indicating an absence of data for all the blocks in the EEPROM 41 to indicate that data is non-existent. On the other hand, if the step S2 identifies that the size is not zero, the sequence proceeds to a step S5 for discriminating whether the memory size coincides with the size in the system controller of the camera C, and, if not, a step S5 indicates a warning on the camera C, and the writing operation into the memory M is not conducted.

If the step S5 identifies that the read memory block size coincides with the size in the camera C, a step S6 reads the absence/presence of data in each block from the EEPROM 141 to search for vacant blocks. As soon as an empty area is detected in a step S7, the camera C enters a stand-by state until the photographing operation in step S8. Then in a Step S9, the camera C sends a write command signal to the microcomputer 140, which, in response, calculates the address by a relation (empty block number x block size), then loads the calculated address into the address counter 122, and releases a ready signal to the status line 16B, whereby the data is stored in succession into the main memory 125 in synchronization with the clock signal 16D. If the step S7 identifies the absence of an empty block, a step S10 displays the memory "full" state and the sequence is terminated.

As explained in the foregoing, the present third embodiment does not require additional terminals in comparison with the foregoing second embodiment, and is still adaptable to any memory block size. It is also possible to prevent erroneous storage of data into a memory apparatus having a different memory block size.

Figure 14:
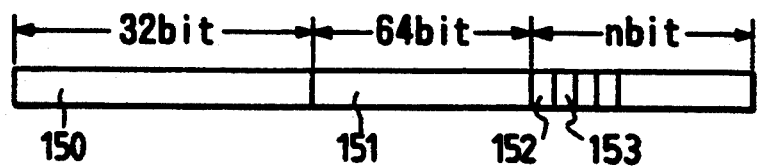
FIG. 14 is a view showing an example of the contents of the storage state holding memory shown in FIG. 11.

FIG. 14 shows an example of the contents of the storage state holding memory 141 shown in FIG. 11, wherein 150 indicates the number of blocks, 151 indicates the number of main memories, and 152 and 153, respectively, indicate first and second blocks, wherein the presence and absence of data in the blocks is indicated by "1" and "0".

Figure 15:
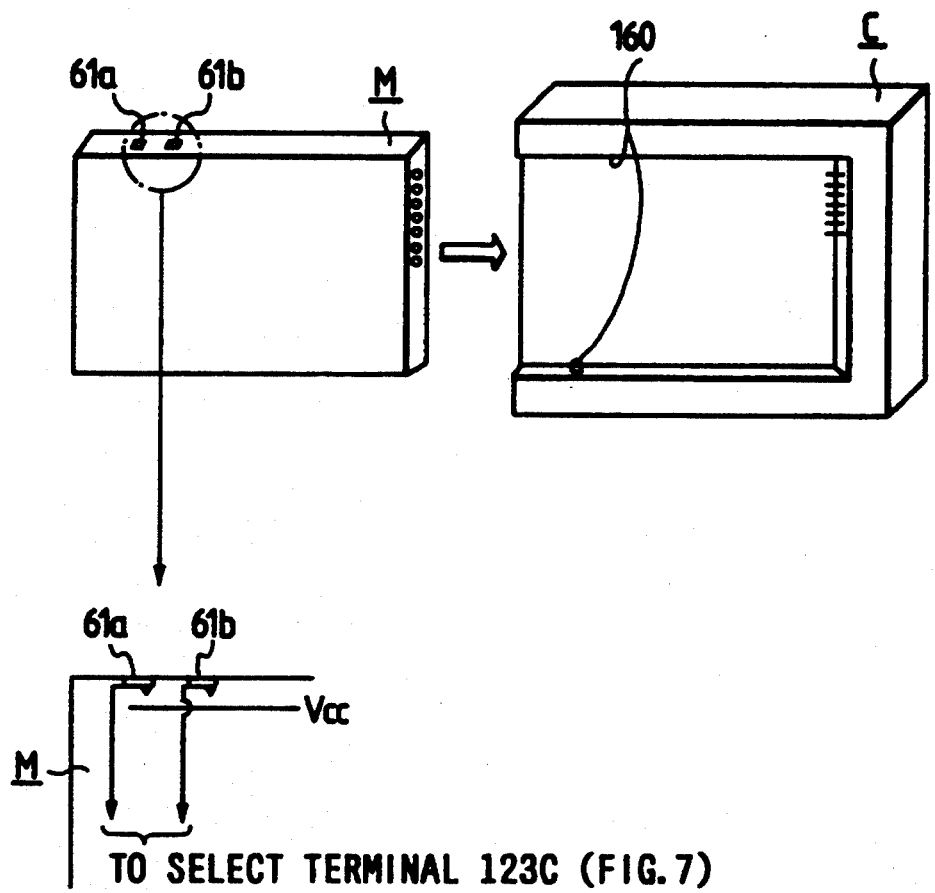
FIG. 15 is a view of a fourth embodiment of the interconnection of memory and camera.

FIG. 15 shows a third embodiment of the interconnection of the camera and the IC memory unit of the present invention. In the present embodiment, a pair of mechanical projections 160 are provided on the camera for stabilizing the connection between the memory M and the camera C, and the memory unit M is provided with holes 61a and 61b, respectively corresponding to the NTSC and PAL systems. As shown in the partial magnified view, the projection 160 engages with either of the holes 61a or 61b, whereby the memory M can detect the characteristic of the camera C, and utilize the result of the detection for selecting the preset ROM 123a or 123b as in the memory apparatus as shown in FIG. 7. The memory M can thus dispense with additional mechanical structure in such an embodiment.

As explained in the foregoing, the present embodiment, featured by the presence of plural address generators in the memory apparatus, provides a memory apparatus not fixed to the data size of an NTSC or PAL system, so that the same memory apparatus an be utilized regardless of the image processing system of the electronic camera.

We claim:

1. A method for providing a display on a device to which a detachable solid state memory device which comprises a plurality of memory blocks is attached, said method comprising the steps of:

determining to which of a plurality of broadcasting system standards a detected size of each of the memory blocks in the solid state memory device corresponds; and providing a display on the device to which the solid state memory device is attached based on the detected size in order to display information corresponding to a size of the memory blocks of the solid state memory device, said providing step providing a characteristic display when the detected size of the memory blocks of said solid state memory device does not correspond to a predetermined size.

2. A method according to claim 1, further comprising a step of warning a user when the detected size of each of the memory blocks is not a predetermined size.

3. A method according to claim 1, further comprising a step of controlling writing of data into the solid state memory device, according to the detected size.

4. A method according to claim 1, further comprising a step of providing a semiconductor memory as the solid state memory device.

5. A system for displaying information on a display, said system comprising:

a detachable memory device which includes:
   a plurality of memory blocks, and
   providing means for providing information identifying to which of a plurality of broadcasting system standards a size of each of the memory blocks corresponds; and an apparatus attached to said detachable memory device, which includes:
   means for receiving the information provided by said providing means, and
   display means for providing a display based on the information received by said receiving means in order to display information corresponding to a size of the memory blocks of the solid state memory device, said display means providing a characteristic display when the detected size of the memory blocks of said solid state memory device does not correspond to a predetermined size.

6. A system according to claim 5, wherein said apparatus further comprises means for converting an image into image data to be written into said detachable memory device.

7. A system according to claim 5, wherein said display means provides a warning when the displayed information indicates that a size of the memory block of the solid state memory device is not a predetermined size.

8. A system according to claim 5, further comprising means for controlling writing of data into said detachable memory device, according to the information received by said receiving means.

9. A system according to claim 5, wherein each memory block stores data corresponding to one picture image.

10. A system according to claim 5, wherein said detachable memory device is a semiconductor memory.

* * * * *